United States Patent [19]
Bednorz et al.

[11] Patent Number: 5,528,052
[45] Date of Patent: * Jun. 18, 1996

[54] SUPERCONDUCTIVE-CHANNEL ELECTRIC FIELD-EFFECT DRIVE

[75] Inventors: Johannes G. Bednorz, Wolfhausen; Jochen D. Mannhart, Thalwil; Carl A. Mueller, Hedingen, all of Switzerland; Darrell G. Schlom, State College, Pa.

[73] Assignee: International Business Machines Corporation, Armonk, N.Y.

[*] Notice: The term of this patent shall not extend beyond the expiration date of Pat. No. 5,240,906.

[21] Appl. No.: 171,888

[22] Filed: Dec. 22, 1993

Related U.S. Application Data

[63] Continuation of Ser. No. 916,569, Jul. 20, 1992, abandoned.

[51] Int. Cl.$^6$ ............ H01L 29/06; H01L 39/22; B05D 5/12; H01B 12/00
[52] U.S. Cl. ............ 257/39; 257/35; 257/38; 505/193; 505/237; 505/239; 427/62; 427/63
[58] Field of Search ............ 257/36–39, 35; 505/1, 701, 702, 193, 233–239; 427/62, 63

[56] References Cited

U.S. PATENT DOCUMENTS

| | | | |
|---|---|---|---|
| 5,075,283 | 12/1991 | De | 505/701 |
| 5,128,316 | 7/1992 | Agostinelli et al. | 505/701 |

FOREIGN PATENT DOCUMENTS

| | | | |
|---|---|---|---|
| 64000779 | 1/1989 | Japan | 257/39 |
| 1162384 | 6/1989 | Japan | 505/702 |
| 01265577 | 10/1989 | Japan | 257/39 |
| 9119026 | 12/1991 | WIPO | 505/701 |

OTHER PUBLICATIONS

Van Duzer et al, "Principles Of Superconductive Devices, and Circuits," Elsevier, New York, 1981, pp. 351–355, Chapter 8.

*Primary Examiner*—Mahshid Saadat
*Attorney, Agent, or Firm*—Daniel P. Morris

[57] ABSTRACT

Proposed is a method for operating a field-effect device comprised of a superconducting current channel having source and drain electrodes connected thereto, said superconducting current channel being separated from a gate electrode by an insulating layer, where the resistance of said current channel is controlled by varying the critical current of the superconducting material through the application of an electrical field across the superconducting current channel, which in turn changes the density of the mobile charge carriers in the superconducting material. Taught is also an inverted MISFET device for performing that method, the device being characterized in that on an electrically conductive substrate an insulating layer is provided which in turn carries a layer consisting of a superconducting material, and that a gate electrode is attached to said substrate, and source and drain electrodes are electrically connected to said superconductor layer. Advantageously, between the substrate and the superconducting layer, a metallic passivation layer may be provided.

9 Claims, 3 Drawing Sheets

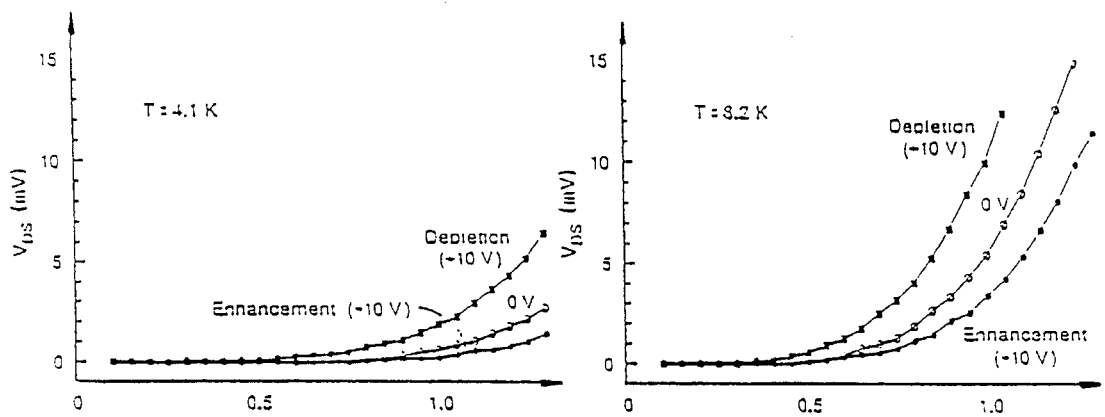
FIG. 7
FIG. 8
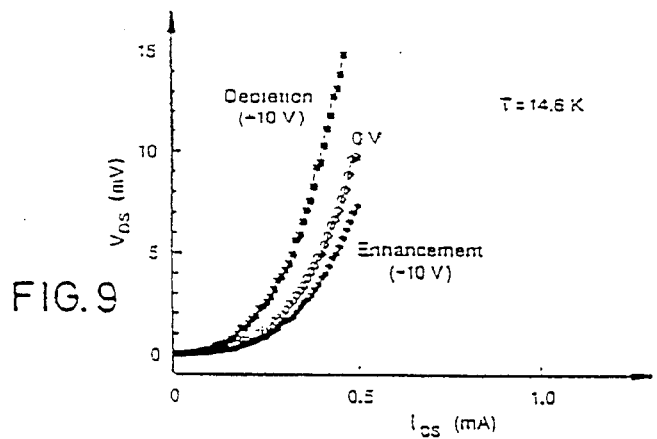
FIG. 9
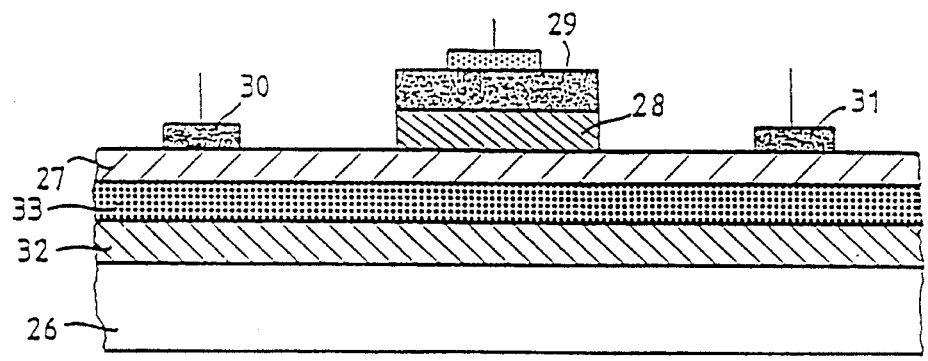
FIG. 10

1

SUPERCONDUCTIVE-CHANNEL ELECTRIC FIELD-EFFECT DRIVE

This is a continuation of application Ser. No. 07/916,569, filed Jul. 20, 1992, now abandoned.

FIELD OF THE INVENTION

The present invention relates broadly to a field-effect device in which an electric current passing through a current channel may be controlled by means of an electric field applied to the channel, and, more particularly, to an electric field-effect device having a current channel composed of a superconductive material. The invention also relates to a method of controlling an electric current in a channel of superconductive material by means of an electric field applied to the channel.

BACKGROUND ART

Electric field-effect devices, such as field-effect transistors (FET), with semiconducting current channels between drain and source electrodes are well known and widely used in many applications. After the discovery of the high-$T_c$ superconductive materials, European published patent application number EP-A-0 324 044 published 19 Jul. 1989 disclosed that high-$T_c$ superconductive materials may bear an electric field effect which is much larger than that in low-$T_c$ superconductive materials. The length scale by which electrostatic fields are screened in conducting materials is generally given by the sum $L_D+L_{DZ}$ of the Debye length $L_D=(\epsilon_o\epsilon_r kT/q^2n)^{1/2}$ and the width of eventual depletion zones $L_{DZ}=N/n$. Here, $\epsilon_o$ and $\epsilon_r$ are the dielectric constants of the vacuum and of the conducting material, respectively, k is Boltzmann's constant, T is the absolute temperature, q is the elementary charge, n is the density of mobile carriers, and N the induced areal carrier density. Because of their high carrier density, low-$T_c$ superconductors usually screen electric fields so well that the fields only have a minor influence on materials properties. To attenuate the screening, recent experiments on the electric field effect in low-$T_c$ superconductors have focused on compounds with exceptionally low carrier density, like doped $SrTiO_3$, with niobium as the dopant, for example ( cf. European published patent application No. EP-A-494,580, published 15 Jul. 1992).

As described in European published application No. EP-A-0 324 044, field-effect devices with superconducting drain-source channels would offer advantages over their semiconducting counterparts. In high-$T_c$ superconductive compounds, larger field-effects can occur owing to their intrinsically low carrier concentration, and because of their small coherence length. The low carrier concentration of roughly 3 to $5\times10^{21}/cm^3$ leads to screening lengths in the range of tenths of nanometers, and the small coherence lengths allow the fabrication of ultrathin layers with respectable critical temperatures. Superconducting films as thin as 1 to 2 nm have been grown; electric fields can penetrate such films to a considerable extent. Various types of FETs with superconducting channels have already been suggested, e.g. in European published patent application No. EP-A-0 324 044; in European published patent application No. EP-A-0 494 580 (application No. 91 810 006.6); in D. F. Moore, "Superconducting Thin Films for Device Applications," *Second Workshop on High Temperature Superconducting Electron Devices*, Jun. 7–9, 1989, Shikabe, Hokaido, Japan, pp. 281–284; and in J. Mannhart et al., "Electric field effect on superconducting $YBa_2Cu_3O_{7-\delta}$ films" *Z. Phys. B—Condensed Matter* vol. 83, pp. 307–311 (1991).

However, the devices of the citations of the previous paragraph generally require either an operating temperature close to a critical temperature $T_c$, as measured effectively approaching the limit of zero current and zero applied magnetic field, or channel layers which are extremely thin.

It is an object of the present invention to provide superconducting field-effect devices where the operation is influenced by the control of critical current and flux flow by an electric field.

It is a further object of the invention to provide for the operation of superconducting field-effect devices at any temperature from T=0 to T≡$T_c$. (It has been observed that the effect is present even at temperatures slightly above the critical temperature $T_c$ as measured in an effectively zero electric field, provided the electric field acts to increase $T_c$).

It is a still further object to provide superconducting field-effect devices whose conducting channel (between drain and source in case of a FET, for example,) may be grown thicker than permitted in conventional prior art devices.

SUMMARY OF THE INVENTION

Broadly, we have invented a field-effect device comprised of a current channel which includes a layer of superconductive material having source and drain electrodes connected thereto. The superconducting current channel is separated from a gate electrode by an insulating layer.

In a first aspect of the superconductive-channel field-effect device of the invention, the gate electrode of the device can include an electrically conductive substrate which is substantially single crystalline having a crystallographically oriented face which defines a channel-support face. The insulating layer and the superconductive layer in turn overlay the channel-support face of the substrate. The insulating layer is substantially single crystalline and bears an at least approximately epitaxial structural relation to the substrate or otherwise has a crystallographic lattice structure which is oriented substantially to a predetermined crystallographic orientation relative to the crystallographic orientation of the channel-support face of the substrate. The superconductive layer bears an at least approximately epitaxial structural relation to the insulating layer. To maintain electrical conductivity of the gate electrode up to an interface with the insulating layer, the channel-support face of the substrate may include a coating of a metal which is effectively chemically inert with respect to the substrate and the insulating layer under processing conditions and which is approximately lattice matched with the oriented channel-support face of the substrate.

In a second aspect of the superconductive-channel electric field-effect device of the invention, the layer of superconductive material may include a first sublayer and a second sublayer in which the superconductive material of the first sublayer has a relatively stronger pinning force than the superconductive material of the second sublayer. The first sublayer of relatively stronger pinning force material is positioned to extend within an electrostatic-field penetration region defined with respect to the gate electrode and the insulating layer of the device so that in operation the electrostatic field produced by the gate electrode penetrates at least partially the first sublayer.

In operation, the superconductive current channel of the device of the invention is cooled to to a temperature close to or below a critical temperature $T_c$ of the superconductive material of the channel. By application of an electric field across the superconductive channel, the density of mobile charge carriers in the superconductive material of the channel may be changed, which tends to change the value of the critical current of the material. By controlling the value of the critical current with the electric field in relation to the value of currents passing through the of the current channel, the resistance of the current channel to the currents may be changed.

BRIEF DESCRIPTION OF THE DRAWINGS

In the following description, preferred embodiments of field-effect devices of the invention and a preferred modes of operation of such field-effect devices in accordance with the invention will be described by way of example, with reference to the drawings, in which:

FIG. 7 is the measured voltage-versus-current characteristic of the i-MISFET device of FIG. 5 at a temperature of about 4.1K, showing the influence of the variation of the gate voltage on the critical current of the superconducting channel;

FIG. 8 is the measured voltage-versus-current characteristic as in FIG. 7 at a temperature of about 8.2K;

FIG. 9 is the measured voltage versus current characteristic as in FIG. 7 at a temperature of about 14.6K; and FIG. 10 is a cross-section through a MISFET device in "normal" geometry with a buffer layer.

BEST AND PREFERRED MODES FOR CARRYING OUT THE INVENTION

Figure 1:
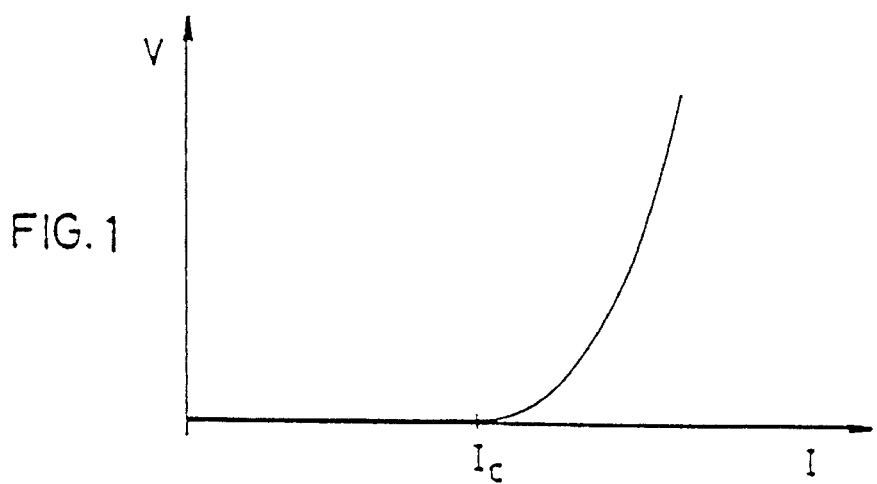
FIG. 1 shows the voltage-versus-current characteristic for a standard superconductor.

FIG. 1 shows the voltage-versus-current characteristic for a standard superconductor cooled to a temperature below the critical temperature $T_c$ of the superconductor. Up to a critical current $I_c$, an electrical current may flow with negligible resistance through the superconductor. If a bias current I greater than the critical current $I_c$ flows through the superconductor, the superconductor is resistive because magnetic flux vortices, driven by a Lorentz force $F_L$ of the bias current I move through the superconductor and generate a voltage V. Below the critical current $I_c$, these flux vortices do not move because they are held in place by so-called pinning sites (cf. W. Buckel, "Supraleitung", Verlag Chemie, Weinheim). These pinning sites hold the flux lines with a pinning force $F_p$. The critical current $I_c$ is determined by a balance of the pinning force and the Lorentz force: $F_p = F_L$. At currents above $I_c$, the voltage V generated by the moving flux lines is proportional to both the number of moving flux lines and to their velocity v. The velocity v is given by $v \equiv \eta F_p$, where $\eta$ is the viscosity factor of flux flow and $F_p$ is the pinning force.

Figure 2:
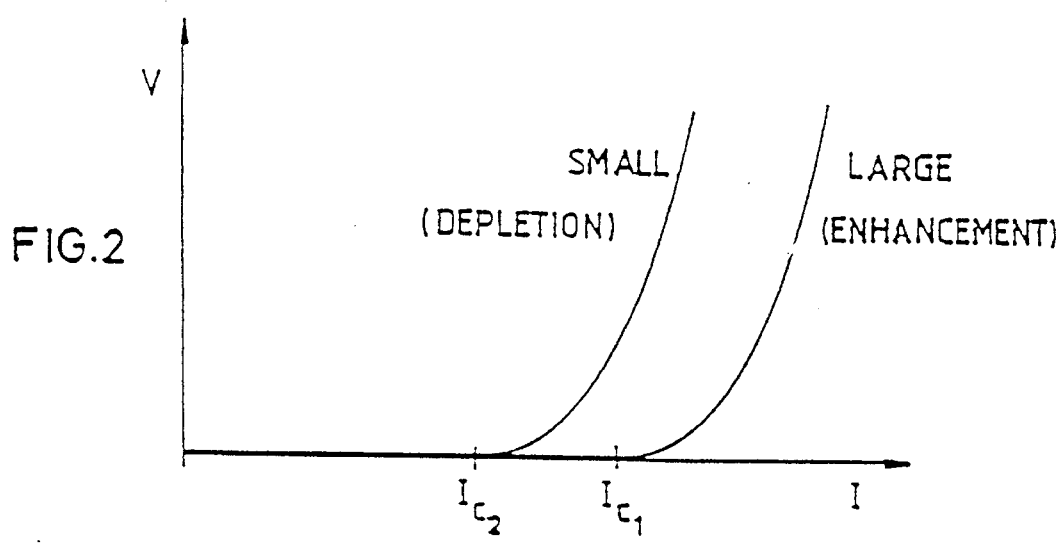
FIG. 2 illustrates the effect of an electrical field on the voltage-versus-current characteristics of a superconductor.

Both the pinning force $F_p$ and the viscosity factor $\eta$ depend on the density of mobile charge carriers n of the superconductor. In general, a larger density of mobile charge carriers n corresponds to a larger $F_p$ and a larger $\eta$. Therefore, the voltage-versus-current characteristic of the superconductor depends on the density of mobile charge carriers n, and if n can be changed by an electrical field E, the voltage-versus-current characteristic can be controlled by $\vec{E}$, as illustrated in FIG. 2. When a superconducting device is biased with a current I, and $I_{c2} < I < I_{c1}$, the resistance of the superconductor may be switched on and off. In FIG. 2, $I_{c1}$ and $I_{c2}$ are the critical currents associated with large and small values for the density n of mobile charge carriers, respectively. In the field-effect device, n is regulated by varying the gate voltage in order to increase ("enhancement" of n) or decrease ("depletion" of n) the number or density of charge carriers n in the superconducting; channel of the device.

It should be pointed out that the density of mobile charge carriers n has to be changed only near the pinning sites, and not throughout all of the superconductor. This offers the potential advantage to change the critical current $I_c$ of thick superconducting films, such as superconductor film 1 in the conventional structure of the metal-insulator-superconductor field-effect transistor (MISFET) device of FIG. 3, with a relatively small electrical field, provided the pinning sites 2 are positioned close to the gate insulator 3 on which a gate electrode 4 is arranged. An electrical field can be applied by supplying a voltage between a gate contact 5 and a source electrode 7. This structure may be arranged on a substrate 6.

The electrical field is screened in the superconductor over a relatively short distance, as described in the above-cited European published patent application No. EP-A-0 324 044. But as long as the pinning sites are located in the volume which is penetrated by the electrical field, the critical current $I_c$ will be changed even if the remainder of the superconductor is well shielded. For this reason, relatively thick superconducting films may be used as drain-source channels. In the case of the high-$T_c$ superconductive material $YBa_2Cu_3O_{7-\delta}$ (with $0<\delta<1$) superconducting films of the material may be made with a thickness of about 10 nm. Films of this order of thickness have important advantages, such as ease of fabrication, higher critical temperature $T_c$, and/or better chemical stability.

The principle of the present invention generally applies to all superconductors and may be realized in many configurations. In the following, a preferred embodiment of a heterostructure employing the high-$T_c$ superconductive material $YBa_2Cu_3O_{7-\delta}$ will be described. Reference is made to the above-cited European published patent application No. EP-A-494,580 and to U.S. patent application Ser. No. 07/864,754, filed 7 Apr. 1992, hereby incorporated by reference.

Structures of this type are manufactured from a layer or substrate of strontium titanate $SrTiO_3$ onto which a film of $YBa_2Cu_3O_{7-\delta}$ is epitaxially grown. As pinning sites for the $YBa_2Cu_3O_{7-\delta}$ film one may use dislocations or point defects, for example. The density of these pinning sites is a function of the growth conditions of the $YBa_2Cu_3O_{7-\delta}$ film, such as the morphology of the (in the case of undoped $SrTiO_3$) substrate surface, growth rate, and growth temperature (cf. European patent application No. EP-A-91 810 470.4), or stoichiometry. With appropriate adjustment of these parameters, a favorable distribution of the pinning sites may be achieved.

Figure 4:
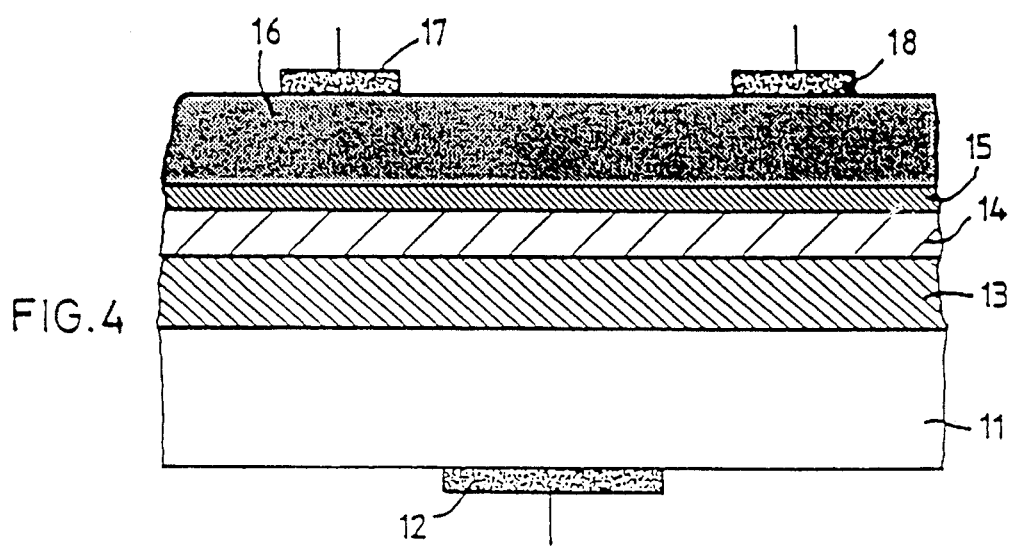
FIG. 4 is a cross-section through a preferred "inverted" MISFET (i-MISFET) device having relatively strong-pinning-force and relatively weak-pinning-force superconducting layers and a normal-conducting buffer layer.

Also, one could take advantage of a multilayer heterostructure as shown in FIG. 4, for example, where films of different superconducting materials and/or of different pinning strengths are employed. A niobium-doped and therefore conductive $SrTiO_3$ substrate 11 carries a gate electrode 12 on its lower face while an insulating layer 13 of undoped $SrTiO_3$ is deposited on its upper face. On top of this insulator layer 13 there is located a thin film 14 of $YBa_2Cu_3O_{7-\delta}$ which has a strong pinning capability. An optional buffer layer 15 consisting, for example, of $PrBa_2Cu_3O_{7-\delta}$ may be provided on top of the superconductor film 14. The uppermost layer 16 of the heterostructure of FIG. 4 is a layer of superconducting $Bi_2Sr_2Ca_2Cu_3O_{10\pm\delta}$, a material which has a weak pinning capability as compared to the pinning capability of the $YBa_2Cu_3O_{7-\delta}$ superconductor layer 14. For electrical contact with the relatively strongly pinning superconductor layer 14, on top of the uppermost relatively weakly-pinning superconductor layer 16 are provided drain and source electrodes 17 and 18, respectively. In view of the fact that said relatively weakly-pinning superconductor: $Bi_2Sr_2Ca_2Cu_3O_{10\pm\delta}$ layer 16, as well as the optional $PrBa_2Cu_3O_{7-\delta}$ layer 15, are conductive, there is a low-resistance contact between said drain and source electrodes 17, 18 end the relatively strongly-pinning superconductor layer 14 in comparison to the resistance the current channel can assume.

The structure of FIG. 4 may be varied regarding the materials employed, as concerns the number of pinning sites created in such materials, and with respect to the thickness of the individual layers. A similar multilayer heterostructure may also be fabricated in a "normal" geometry MISFET, such as that shown in FIG. 3, with additional weak pinning superconducting or other conducting layers present beneath layer 1. Such a structure is shown in FIG. 10.

Turning now to FIG. 10, a MISFET device in a "normal" geometry would comprise a non-conductive substrate 26, a first layer 27 consisting of a superconductive material having a first pinning force and overlaying said substrate 26. An insulating layer 28 is placed on top of said first superconductive layer 27. The insulating layer 28 is in turn overlaid by a gate electrode 29, and source and drain electrodes 30 and 31 are electrically connected to said first superconductive layer 27. Between said first superconductive layer 27 and said substrate 26 is disposed a second superconductive layer 32 having a second pinning force weaker than the pinning force of the first superconductive layer 27. Optionally, between the first and second superconductive layers 27 and 32, an electrically a conductive buffer layer 33 may be provided.

In a preferred embodiment of the invention, said second, relatively weaker pinning force superconductive layer 32 consists of $Bi_2Sr_2Ca_2Cu_3O_{10\pm\delta}$, and the conductive buffer layer 33 consists of $PrBa_2Cu_3O_{7-\delta}$, where $0<\delta<1$.

Figure 5:
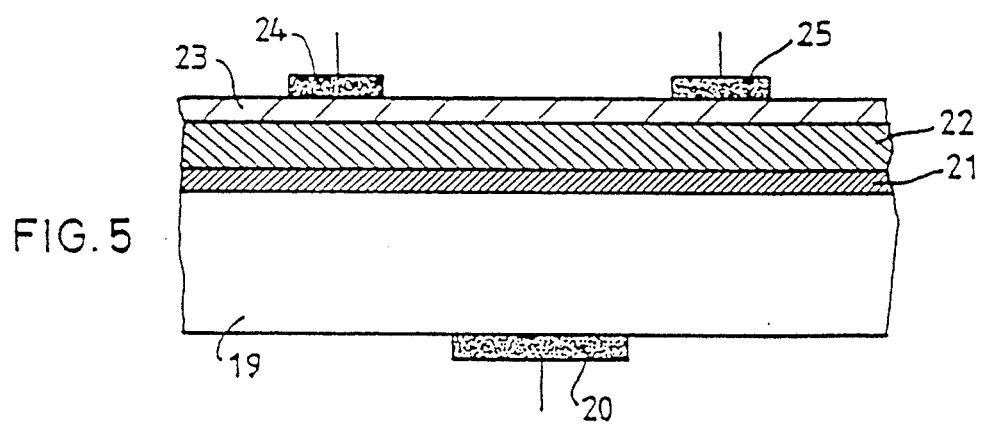
FIG. 5 is a cross-section through a preferred i-MISFET device having a normal-conducting buffer layer.

In an experiment to demonstrate the effect of electrical fields on pinning and, thus, the control of the critical current of a superconductive channel, a heterostructure (inverted metal-insulator-superconductor field-effect transistor (i-MISFET) was grown essentially in accordance with the teaching of the above-cited U.S. patent application Ser. No. 07/864,754, filed 7 Apr. 1992. FIG. 5 shows the structure of this i-MISFET.

Turning now to FIG. 5, the gate 19 of the i-MISFET included a conducting n-type approximately 0.05% Nb-doped $SrTiO_3$ (100) essentially single crystalline substrate grown by a floating-zone technique. A silver Ag contact 20 was fixed to one face of the: $Nb:SrTiO_3$ substrate. The substrate of the gate 19 was heated to about 600° C. and a thin (i.e. approximately 2 to 5 nm thick) epitaxial passivation layer 21 of platinum Pt was deposited by electron-beam evaporation onto an upper, channel-support face of the substrate opposing the face bearing the Ag contact 20. At a substrate temperature $T_{sub}$ of about 680° C., a (100) oriented layer 22 of undoped $SrTiO_3$, about 500 nm thick, was deposited by radio frequency (RF) magnetron sputtering in an approximately 6.7 Pa argon-oxygen ambient, with the ratio of the partial pressure of argon to the partial pressure of oxygen being approximately two to one.

Without leaving the vacuum environment, a layer 23 of $YBa_2Cu_3O_{7-\delta}$, between about 4 and about 10 nm thick, was then deposited by DC magnetron sputtering at a substrate temperature $T_{sub}$ of about 750° C. and in an argon-oxygen ambient at a pressure of about 90 Pa, with the ratio of argon partial pressure to oxygen partial pressure being approximately two to one. The structure was then cooled in oxygen at a pressure of about 50 kPa. Using conventional photolithography and wet etching in dilute $H_3PO_4$, the structure was patterned, add gold contact pads 24 and 25 were made to form source and drain electrodes, respectively. The structures prepared in accordance with the method just described had a gate resistivity of approximately $10^{12}$–$10^{13}$ $\omega$cm at about 10 V in both polarities, increasing rapidly with decreasing gate voltage.

It was found that without the presence of a platinum layer 21, the surface region of the normally conducting $Nb:SrTiO_3$ substrate of the gate 19 was degraded and insulating, resulting in a dramatic lowering of the capacitance $C_{GS}$ between gate contact 20 and source 24 of the i-MISFET structure. This degraded the performance of the device so that only a few percent resistivity modulation was observed. With the platinum layer 21, however, $C_{GS}$ was improved by roughly three-fold and more than an order of magnitude improvement in resistivity modulation was observed.

It is worth noting that in addition to the beneficial effect of Pt layer 21 diffusing into the dead surface layer of the Nb-doped gate substrate 19, Pt diffusion through the undoped $SrTiO_3$ layer 22 into the $YBa_2Cu_3O_{7-\delta}$ superconducting channel layer 23 did occur for the processing conditions used. This resulted in a broadening of the superconducting transition. For this reason, best results were achieved with relatively thin Pt layers 21 and comparatively thick $SrTiO_3$ layers 22. By lowering the processing temperatures after the deposition of the Pt layer 21, further improvements in device performance may be expected.

Platinum was found to be beneficial for improving the properties of the dead layer at the surface of the $Nb:SrTiO_3$ substrates for several reasons: It is highly conductive, it is resistant to oxidation (namely to the oxidizing conditions during the deposition of the undoped $SrTiO_3$ and $YBa_2Cu_3O_{7-\delta}$ films), and, its lattice constant and its coefficient of thermal expansion are close to those of $SrTiO_3$ and $YBa_2Cu_3O_{7-\delta}$. Besides satisfying these issues of structural compatibility, platinum is reasonably chemically compatible, i.e. it does not significantly react with, or impair the properties of the insulating and superconducting layers, respectively.

Besides platinum, there are other materials that satisfy many of these constraints and that may be useful for this application. Examples are rhodium Rh, palladium Pd, silver Ag, gold Au, and their alloys. In particular, the lattice constant of Pt-Rh alloys can be varied between about 0.3804 nm (for pure Rh) and about 0.3924 nm (for pure Pt) by controlling the composition of the alloy during deposition. This ability allows for an even better lattice match to the surrounding layers to be obtained. The appropriate alloy composition yielding roughly a desired lattice constant can be calculated with Vegard's law, as follows:

For two components of an alloy, A and B, having the same crystal structure, and for which a substitutional solid solution exists, the lattice constant $a_{mix}$ of a mixture containing x atomic % of A and (1−x) atomic % of B is approximately given by:

$$a_{mix} \cong x \cdot a_A + (1-x) a_B$$

where $a_A$ and $a_B$ are respectively the lattice constants of pure A and pure B.

Figure 6:
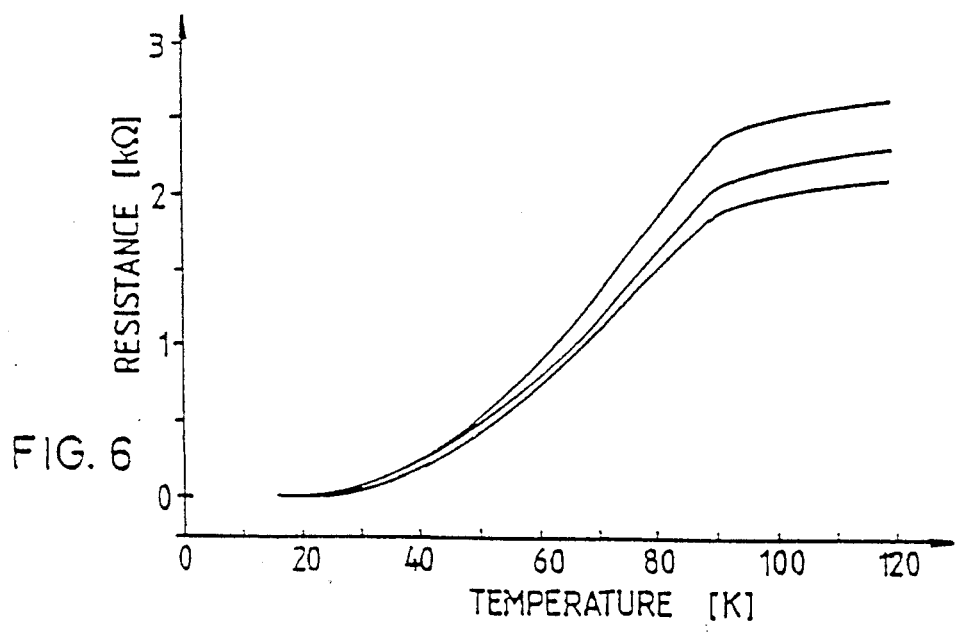
FIG. 6 is a resistance versus temperature R(T) diagram showing the influence the variation of the gate voltage has on the resistance of the field-effect device.

In the structure manufactured as described above, the $YBa_2Cu_3O_{7-\delta}$ film 15 became superconducting at about 14K as shown in FIG. 6. FIGS. 7, 8 and 9 show three drain-source voltage-versus-current characteristics measured respectively at about 4.1K, about 8.2K, and about 14.6K, with the gate voltage as a parameter. Applying a positive bias voltage between the gate and source contacts ($V_{BS}>0$) decreases (depletes) the carrier concentration in the channel of the p-type superconductor, whereas applying a negative bias voltage ($V_{GS}<0$) increases (enhances) the carrier concentration in the channel. FIGS. 7, 8, and 9 show that a gate voltage change of approximately ±10 V causes a variation of the critical current leading to a shift in the drain-source voltage versus current $V_{DS}(I_{DS})$ characteristic of about ±200 μA.

Figure 3:
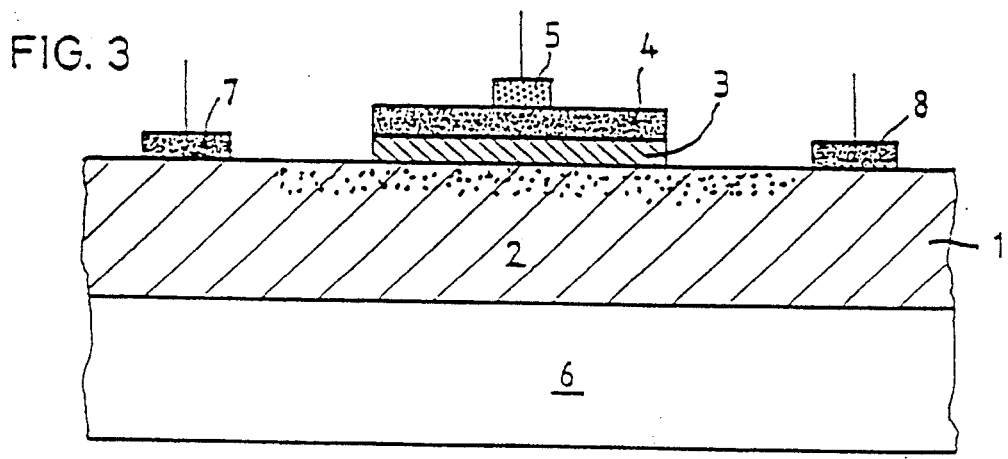
FIG. 3 shows the location of the pinning sites close to the insulator/superconductor interface in a "normal" MISFET device.

It is pointed out that for $YBa_2Cu_3O_{7-\delta}$ films, the voltage-versus-current curves below $T_c$ are usually smooth, and do not display any well-defined feature suited for determining the critical current density; cf. FIGS. 1 and 3 of J. S. Satchell et al, "Electrical Properties of $YBa_2Cu_3O_7$ Thin Films", *Physica C*, 162–1164 (1989) p. 625. This problem makes it difficult to provide an accurate number for the field-induced change of the critical current, but this is believed to be within a ±100 to ±200 μA range. While the measurements that lead to FIGS. 7, 8, and 9 were made with a gate voltage of approximately ±10 V, it will be clear to those skilled in the art that operation of the taught structure is possible generally with gate voltages in the range between about 1 and about 100 V.

It is not intended to limit the present invention to the specific embodiments described above. It is recognized that changes may be made in the devices and methods specifically described herein without departing from the scope and teaching of the instant invention, and it is intended to encompass all other embodiments, alternatives, and modifications consistent with the invention.

We claim:

1. A superconductive-channel electric field-effect device comprising:

(a) a substantially single-crystalline substrate composed of an electrically-conductive material, the substrate having two opposing faces which are substantially planar and substantially parallel to one another, a first of the two faces of the substrate being crystallographically oriented and defining a channel-support face and a second, opposing face defining a gate-contact face;

(b) a gate contact adjacent to and in electrical contact with the gate-contact face of the substrate;

(c) a passivation layer coating the channel-support face of the substrate and making electrical contact with the substrate, the passivation layer being composed of a metal selected from the group consisting of platinum, rhodium, palladium, silver, gold, and their alloys, the passivation layer being approximately epitaxially lattice matched in crystal structure to the crystal structure of the crystallographically oriented channel-support face of the substrate;

(d) an insulator layer coating the passivation layer on a side opposing the substrate, the insulator layer being made of an electrically insulative material, the insulator layer having a substantially single-crystalline crystallographic lattice structure which is oriented substantially to a predetermined crystallographic orientation relative to the crystallographic orientation of the channel-support face of the substrate;

(e) a layer of superconductive material coating the insulator layer on a side opposing the passivation layer, the layer of superconductive material having a crystallographic lattice structure which is an in at least approximately epitaxial relationship to the crystal structure of the insulator layer;

(f) a source electrode in electrical contact with the layer of superconductive material; and (g) a drain electrode in electrical contact with the layer of superconductive material spaced apart from the source electrode, an electric-current channel extending between the source electrode and the drain electrode being defined in the layer of superconductive material.

2. The superconductive-channel electric field-effect device of claim 1 in which the substrate is composed of niobium-doped strontium titanate $Nb:SrTiO_3$, the insulator material is composed of essentially undoped strontium titanate $SrTiO_3$ and the layer of superconductive material is composed of yttrium barium copper oxide $YBa_2Cu_3O_{7-\delta}$.

3. The superconductive-channel electric field-effect device of claim 2 in which the channel-support face of the $Nb:SrTiO_3$ substrate has an approximately (100) crystallographic orientation and the $SrTiO_3$ insulator layer has an approximately (100) crystallographic orientation.

4. A superconductive-channel, electric field-effect device comprising an electrically conductive substrate, an insulating layer disposed on the substrate, a layer comprised of a superconductive material disposed on the insulating layer, a gate electrode being attached to said substrate, and source and drain electrodes being electrically connected to said superconductive layer; CHARACTERIZED in that on top of said superconductive layer second superconductive layer having a weaker pinning force than said superconductive layer is disposed, and that said source and drain electrodes are attached to said relatively weaker-pinning-force second superconducting layer.

5. The superconductive-channel, electric field-effect device in accordance with claim 4, CHARACTERIZED in that between said superconductive layer and said weaker-pinning-force second superconductive layer a conducting buffer layer is provided.

6. The superconductive-channel, electric field-effect device in accordance with claim 5, CHARACTERIZED in that said relatively weaker-pinning-force second superconductive layer consists of $Bi_2Sr_2Ca_2Cu_3O_{10\pm\delta}$ and that said conductive buffer layer consists of $PrBa_2Cu_3O_{7-\delta}$, where $0<\delta<1$.

7. A superconductive-channel, electric field-effect-device comprising: a non-conductive substrate; a first layer consisting of a superconductive material having a first pinning force, an insulator layer being in turn overlaid by a gate electrode, source and drain electrodes disposed in contact with said first superconductive layer, wherein between said first superconductor layer and said substrate a second superconductor layer having a second pinning force weaker than said first pinning force of said first superconductor material is disposed.

8. The superconductive-channel, electric field-effect device in accordance with claim 7, CHARACTERIZED in that between said first and second superconductive layers a conductive buffer layer is provided.

9. The superconductive-channel, electric field-effect device in accordance with claim 8, CHARACTERIZED in that said first relatively stronger-pinning-force superconductive layer consists of $YBa_2Cu_3O_{7-\delta}$, that said second, relatively weaker pinning force superconductive layer consists of $Bi_2Sr_2Ca_2Cu_3O_{10\pm\delta}$, and that said conductive buffer layer consists of $PrBa_2Cu_3O_{7-\delta}$, where $0<\delta<1$.

* * * * *